US009582216B2

(12) United States Patent
Vembu et al.

(10) Patent No.: US 9,582,216 B2
(45) Date of Patent: Feb. 28, 2017

(54) METHOD AND DEVICE TO DISTRIBUTE CODE AND DATA STORES BETWEEN VOLATILE MEMORY AND NON-VOLATILE MEMORY

(75) Inventors: Balaji Vembu, Folsom, CA (US); Murali Ramadoss, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 13/977,295

(22) PCT Filed: Dec. 28, 2011

(86) PCT No.: PCT/US2011/067490
§ 371 (c)(1),
(2), (4) Date: Jun. 28, 2013

(87) PCT Pub. No.: WO2013/100936
PCT Pub. Date: Jul. 4, 2013

(65) Prior Publication Data
US 2014/0208047 A1    Jul. 24, 2014

(51) Int. Cl.
*G06F 12/00*    (2006.01)
*G06F 13/00*    (2006.01)
(Continued)

(52) U.S. Cl.
CPC .......... *G06F 3/0638* (2013.01); *G06F 3/0604* (2013.01); *G06F 3/0683* (2013.01);
(Continued)

(58) Field of Classification Search
None
See application file for complete search history.

(56) References Cited

U.S. PATENT DOCUMENTS 6,574,747 B2 *    6/2003    Ginsberg ............... 714/6.13
8,566,561 B2 *    10/2013    Rischar ............... G05B 19/042
                                                  711/103
(Continued)

FOREIGN PATENT DOCUMENTS

WO    2013/100936 A1    7/2013

OTHER PUBLICATIONS

International Preliminary Report on Patentability and Written Opinion received for PCT Patent Application No. PCT/US2011/067490, mailed on Jul. 10, 2014, 6 pages.
(Continued)

*Primary Examiner* — Idriss N Alrobaye
*Assistant Examiner* — Richard B Franklin
(74) *Attorney, Agent, or Firm* — Compass IP Law

(57) ABSTRACT

A method, device, and system to distribute code and data stores between volatile and non-volatile memory are described. In one embodiment, the method includes storing one or more static code segments of a software application in a phase change memory with switch (PCMS) device, storing one or more static data segments of the software application in the PCMS device, and storing one or more volatile data segments of the software application in a volatile memory device. The method then allocates an address mapping table with at least a first address pointer to point to each of the one or more static code segments, at least a second address pointer to point to each of the one or more static data segments, and at least a third address pointer to point to each of the one or more volatile data segments.

15 Claims, 5 Drawing Sheets

(51) Int. Cl.
*G06F 3/06* (2006.01)
*G06F 12/02* (2006.01)
*G06T 1/60* (2006.01)
*G11C 14/00* (2006.01)

(52) U.S. Cl.
CPC ............ *G06F 12/0292* (2013.01); *G06T 1/60* (2013.01); *G11C 14/0045* (2013.01); *G06F 2212/205* (2013.01); *Y02B 60/1225* (2013.01)

(56) References Cited

U.S. PATENT DOCUMENTS

| | | | |
|---|---|---|---|
| 8,607,210 B2* | 12/2013 | Mollichelli et al. | 717/159 |
| 8,713,241 B2* | 4/2014 | Borras et al. | 711/103 |
| 8,891,319 B2* | 11/2014 | Castro et al. | 365/189.15 |
| 2005/0080986 A1* | 4/2005 | Park | 711/103 |
| 2005/0251617 A1* | 11/2005 | Sinclair | G06F 3/061 |
| | | | 711/103 |
| 2006/0143600 A1* | 6/2006 | Cottrell et al. | 717/168 |
| 2009/0138654 A1 | 5/2009 | Sutardja | |
| 2010/0082883 A1 | 4/2010 | Chen et al. | |
| 2011/0153916 A1 | 6/2011 | Chinnaswamy et al. | |
| 2014/0082262 A1* | 3/2014 | Nachimuthu | G06F 12/00 |
| | | | 711/103 |

OTHER PUBLICATIONS

International Search Report and Written Opinion received for PCT Patent Application No. PCT/US2011/067490, mailed on Aug. 31, 2012, 5 pages.

\* cited by examiner

METHOD AND DEVICE TO DISTRIBUTE CODE AND DATA STORES BETWEEN VOLATILE MEMORY AND NON-VOLATILE MEMORY

FIELD OF THE INVENTION

The invention relates to allocating a combination of volatile memory and non-volatile memory for storage of code and data sections of a software application.

DESCRIPTION OF THE RELATED ART

Memory performance and capacity requirements continue to increase across many aspects of the computing industry. In addition, memory power requirements and memory cost have become a significant component of the overall power and cost, respectively, of a given computing system ranging from a smart phone to a server. Memory and storage subsystems can increase or decrease the overall performance of a computing device depending on implementation specifics. Because it is generally desirable to have faster performing computing devices that utilize less power and cost less, a wide variety of designs of the memory and storage subsystems exist that attempt to maximize end user perceived performance while minimizing cost and power consumption.

Current operating systems provide an application programming interface (API) to allow for applications and drivers to request memory from paged and non-paged pools. Non-paged pools are typically used for data that must not be paged to a mass storage drive (e.g., pages that hardware is expected to access during execution of the application). Since currently all allocated pages are accessed when in DRAM so there is no additional information required at page allocation time whether the data that is going to be stored within an allocated buffer is expected to be for just reading versus read-and-write.

BRIEF DESCRIPTION OF THE DRAWINGS

The following description and accompanying drawings are used to illustrate embodiments of the invention. In the drawings.

DETAILED DESCRIPTION

Many embodiments described below resolve code and data usage challenges introduced to the memory and storage subsystems of a computing device by subdividing the performance requirement and the capacity requirement between diverse memory technologies. The focus of this approach is on providing performance with a relatively small amount of a higher-speed memory such as dynamic random access memory (DRAM) while implementing the bulk of the system memory using a significantly cheaper and denser non-volatile memory. Several embodiments described below define platform configurations that enable hierarchical memory subsystem organizations for the use of a certain type of non-volatile memory, specifically referred to as non-volatile random access memory (NVRAM) to augment volatile memory, by one or more graphics processors in a computing device. The use of the NVRAM in the memory hierarchy additionally allows non-volatile memory mass storage implementations as a substitute for standard mass storage drives.

Figure 1:
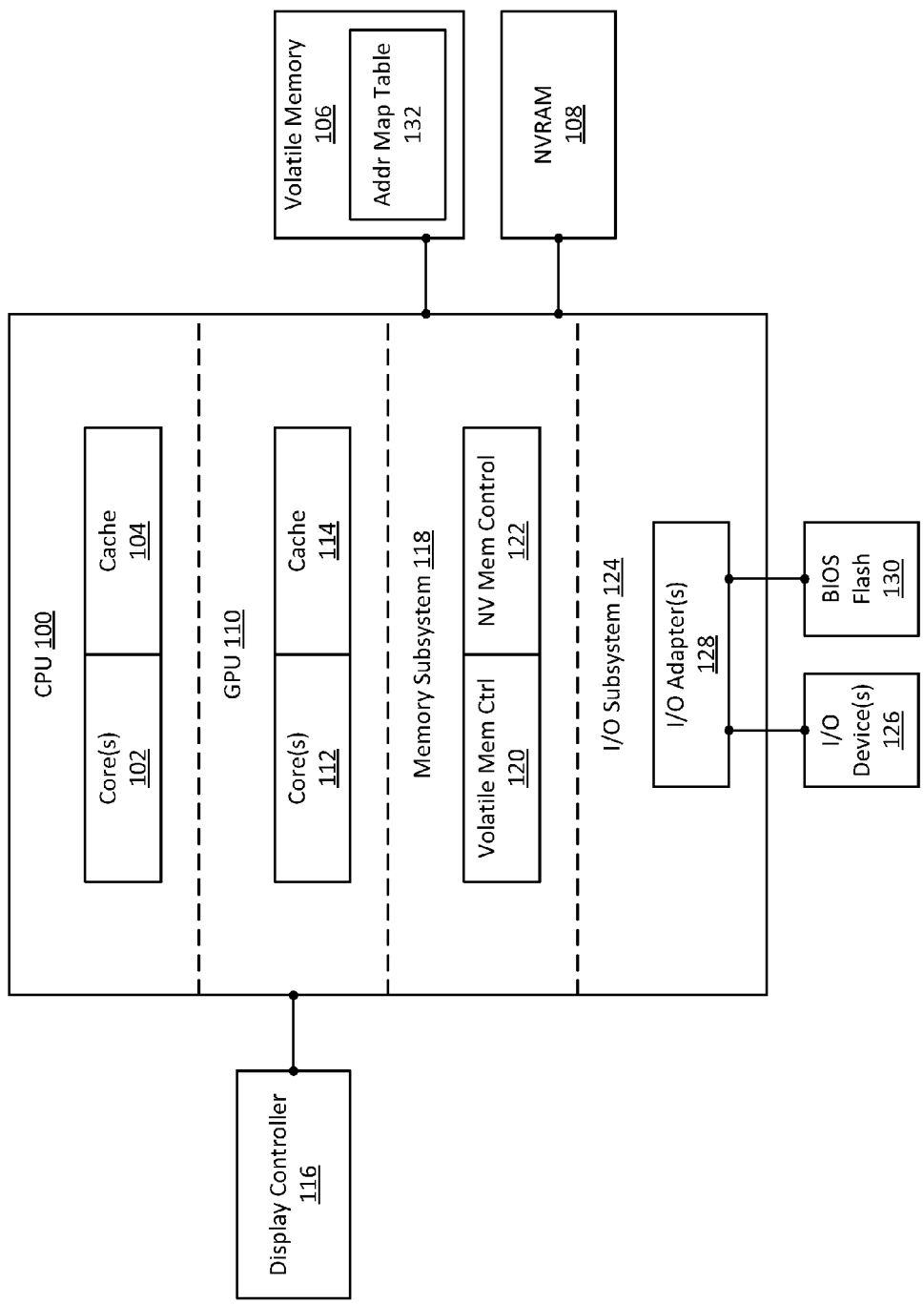
FIG. 1 illustrates an embodiment of a memory arrangement that allows a computer system to utilize a hybrid memory structure for code and data storage for processors as well as for embedded systems.

FIG. 1 illustrates an embodiment of a memory arrangement that allows a computer system to utilize a hybrid memory structure for code and data storage for processors as well as for embedded systems.

A central processing unit (CPU), a graphics processing unit (GPU), and an embedded processor may be provided access to both volatile and non-volatile forms of memory according to several embodiments. The CPU and GPU can also be referred to as "processors" throughout this document. These different nomenclatures are utilized.

FIG. 1 shows a number of logic units which may or may not be located on the same or different semiconductor dies or the same or different semiconductor package. Logic units in FIG. 1 include a CPU that has one or more cores and a cache, a GPU that also has one or more cores and a cache, a memory subsystem, and an I/O subsystem. These units are separated by dotted lines to show the possibility that each of these logic blocks may or may not be located in the same semiconductor die and/or package.

Turning now to the detailed elements of FIG. 1, a CPU 100 is present. This CPU includes one or more cores 102. Although not shown, each core may internally include one or more instruction/data caches, execution units, prefetch buffers, instruction queues, branch address calculation units, instruction decoders, floating point units, retirement units, etc. In other embodiments that are not shown, the system may include multiple CPUs, each with its own set of logic units that are displayed in FIG. 1.

The CPU 100 includes at least one lower level cache, such as cache 104. This may be a general purpose cache that is capable of storing a significant amount of data retrieved from memory locations in volatile memory 106 and/or an NVRAM 108. In different embodiments, cache 104 may be shared among all cores or each core may have its own lower level cache.

CPU 100 may also include additional logic that is not shown which coordinates and operates at least core(s) 102. In some embodiments, this additional logic may be referred to as a home agent. The home agent may include, for example, a power control unit (PCU). The PCU may include logic and components needed for regulating the power state of the core(s) 102 among other tasks.

According to several embodiments, the computer system in FIG. 1 additionally includes a GPU 110. The GPU 110 also may include one or more core(s) 112. Each core may include one or more execution units and one or more instruction and data caches utilized to feed the execution units with information to process. Additionally the GPU 110 may contain other graphics logic units that are not shown in FIG. 1, such as one or more vertex processing units, rasterization units, media processing units, and codecs among others. For sake of simplicity, the specific logic within the core(s) 112 as well as other graphics-related logic units within the GPU 110 are not shown.

There may be one or more lower level caches in GPU 110 as well, such as cache 114. This cache may be utilized as a general purpose cache or a cache specific to one or more particular types of graphics data (e.g., vertex data). Other lower level caches are not shown, though in some embodiments multiple caches like cache 114 exist within GPU 110.

According to many embodiments, a display controller 116 is communicatively coupled to the GPU 110. The display controller 124 receives information to be displayed upon a display device (e.g., a monitor, a television, a projector, etc.). In many embodiments, the display controller 116 specifically receives frame buffers. Each frame buffer consists of an image comprising pixels that is then interpreted by the display controller and the image is fed to the display device for viewing. Depending on the refresh frequency of the display device, frame buffers may be fed to the display controller 116 a certain number of times per second. For example, a 60 Hz refresh rate utilizes 60 images (frame buffers of image information) per second. Different display devices may utilize higher frequency refresh rates and simply re-sample the same frame buffer two or more times prior to utilizing anew frame buffer of information to display.

A memory subsystem 118 is also present in FIG. 1. There is a volatile memory controller 120, which may be utilized to provide access to volatile memory 106. Volatile memory controller 120, which is integrated into the CPU package or discrete from the CPU package in different embodiments, may receive a memory access request from a CPU core 102 or a GPU core 112 and route that request to volatile memory 106. Likewise, non-volatile (NV) memory controller 122 may receive a memory access request from a CPU core 102 or a GPU core 112 and route that request to NVRAM 108. In some embodiments, the volatile memory controller 120 and non-volatile memory controller 122 are integrated into one large memory controller. In other embodiments they are separate controllers.

In many embodiments, an input/output (I/O) subsystem 124 is present in the system in FIG. 1 to communicate with I/O devices, such as I/O device(s) 126. Within the I/O subsystem 124, one or more I/O adapter(s) 128 are present to translate a host communication protocol utilized within the CPU 100 to a protocol compatible with particular I/O devices. Some of the protocols that adapters may be utilized for translation include Peripheral Component Interconnect (PCI)-Express (PCI-E), 3.0; Universal Serial Bus (USB), 3.0; Serial Advanced Technology Attachment (SATA), 3.0; Small Computer System Interface (SCSI), Ultra-640; and Institute of Electrical and Electronics Engineers (IEEE) 1394 "Firewire;" among others.

Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

A Basic Input/Output System (BIOS) flash 130 device may additionally be present in the system to provide a set of boot instructions when the system powers on or reboots. For BIOS flash 130 device, some of the protocols that I/O adapters 128 may translate include Serial Peripheral Interface (SPI) and Microwire among others.

Returning to the NVRAM 108, an overview of the NVRAM is provided below.

1. Non-Volatile Random Access Memory Overview

There are many possible technology choices for NVRAM, including PCM, Phase Change Memory and Switch (PCMS) (the latter being a more specific implementation of the former), byte-addressable persistent memory (BPRAM), storage class memory (SCM), universal memory, Ge2Sb2Te5, programmable metallization cell (PMC), resistive memory (RRAM), RESET (amorphous cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM)), STRAM (spin tunneling RAM), magnetoresistive memory, magnetic memory, magnetic random access memory (MRAM), and Semiconductor-oxide-nitride-oxide-semiconductor (SO-NOS, also known as dielectric memory).

NVRAM has the following characteristics:

It maintains its content even if power is removed, similar to FLASH memory used in solid state disks (SSD), and different from SRAM and DRAM which are volatile;

it has lower overall power consumption than volatile memories such as SRAM and DRAM;

it has random access similar to SRAM and DRAM (also known as randomly addressable);

it is rewritable and erasable at a lower level of granularity (e.g., byte level) than FLASH found in SSDs (which can only be rewritten and erased a "block" at a time—minimally 64 Kbyte in size for NOR FLASH and 16 Kbyte for NAND FLASH);

it is used as a system memory and allocated all or a portion the system memory address space;

it is capable of being coupled to the CPU over a bus (also interchangeably referred to as an interconnect or link) using a transactional protocol (a protocol that supports transaction identifiers (IDs) to distinguish different transactions so that those transactions can complete out-of-order) and allowing access at a level of granularity small enough to support operation of the NVRAM as system memory (e.g., cache line size such as 64 or 128 byte). For example, the bus/interconnect may be a memory bus (e.g., a double data rate (DDR) bus such as DDR3, DDR4, etc.) over which is run a transactional protocol as opposed to the non-transactional protocol that is normally used. As another example, the bus may one over which is normally run a transactional protocol (a native transactional protocol), such as a PCI express (PCIE) bus, desktop management interface (DMI) bus, or any other type of bus utilizing a transactional protocol and a small enough transaction payload size (e.g., cache line size such as 64 or 128 byte); and it also has one or more of the following characteristics:

it has faster write speed than non-volatile memory/storage technologies such as FLASH;

it has very high read speeds (faster than FLASH and near or equivalent to DRAM read speeds);

it is directly writable (rather than requiring erasing (overwriting with 1s) before writing data like FLASH memory used in SSDs); and/or it allows a greater number of writes before failure (more than boot ROM and FLASH used SSDs).

As mentioned above, in contrast to FLASH memory, which must be rewritten and erased a complete "block" at a time, the level of granularity at which NVRAM is accessed in any given implementation may depend on the particular memory controller and the particular memory bus or other type of bus to which the NVRAM is coupled. For example, in some implementations where NVRAM is used as system memory, the NVRAM may be accessed at the granularity of a cache line (e.g., a 64-byte or 128-Byte cache line), notwithstanding an inherent ability to be accessed at the granularity of a byte, because cache line is the level at which the memory subsystem accesses memory. Thus, when NVRAM is deployed within a memory subsystem, it may be accessed at the same level of granularity as DRAM used in the same memory subsystem. Even so, the level of granularity of access to the NVRAM by the memory controller and memory bus or other type of bus is smaller than that of the block size used by Flash and the access size of the I/O subsystem's controller and bus.

NVRAM may also incorporate wear leveling algorithms to account for the fact that the storage cells begin to wear out after a number of write accesses, especially where a significant number of writes may occur such as in a system memory implementation. Since high cycle count blocks are most likely to wear out in this manner, wear leveling spreads writes across the far memory cells by swapping addresses of high cycle count blocks with low cycle count blocks. Note that most address swapping is typically transparent to application programs because it is handled by hardware, lower-level software (e.g., a low level driver or operating system), or a combination of the two.

The NVRAM is distinguishable from other instruction and data memory/storage technologies in terms of its characteristics and/or its application in the memory/storage hierarchy. For example, NVRAM is different from:

static random access memory (SRAM) which may be used for level 0 and level 1 internal processor caches dedicated to each core within a processor and lower level cache (LLC) shared by cores within a processor;

dynamic random access memory (DRAM) configured as a cache internal to a processor die (e.g., on the same die as the processor), configured as one or more caches external to a processor die (e.g., in the same or a different package than the processor die), or general system memory external to the processor package; and FLASH memory/magnetic disk/optical disc applied as mass storage; and memory such as FLASH memory or other read only memory (ROM) applied as firmware memory (which can refer to boot ROM, BIOS Flash, and/or TPM Flash).

In FIG. 1, NVRAM 108 may be used as instruction and data storage that is directly addressable by a CPU 100 and is able to sufficiently keep pace with the CPU 100 in contrast to FLASH/magnetic disk/optical disc applied as mass storage. Direct addressability refers to a processor, such as a CPU or GPU, being able to send memory requests to the NVRAM as if it were standard DRAM (e.g., through standard memory store and load commands). Moreover, as discussed above and described in detail below, NVRAM 108 may be placed on a memory bus and may communicate directly with a memory controller that, in turn, communicates directly with the processor 100.

NVRAM 108 may be combined with other instruction and data storage technologies (e.g., DRAM) to form hybrid memories (also known as Co-locating PCM and DRAM; first level memory and second level memory; FLAM (FLASH and DRAM)). Note that at least some of the above technologies, including PCM/PCMS may be used for mass storage instead of, or in addition to, system memory, and need not be random accessible, byte addressable or directly addressable by the processor when applied in this manner.

For convenience of explanation, most of the remainder of the application will refer to "NVRAM" or, more specifically, "PCM," or "PCMS" as the technology selection for the non-volatile memory. As such, the terms NVRAM, PCM, and PCMS may be used interchangeably in the following discussion. However it should be realized, as discussed above, that different technologies may also be utilized.

2. Volatile Memory Overview

"Volatile memory" 106 is an intermediate level of memory configured in conjunction with NVRAM 108 that has lower read/write access latency relative to NVRAM 108 and/or more symmetric read/write access latency (i.e., having read times which are roughly equivalent to write times). In some embodiments, the volatile memory 106 has significantly lower write latency than the NVRAM 108 but similar (e.g., slightly lower or equal) read latency; for instance the volatile memory 106 may be a volatile memory such as volatile random access memory (VRAM) and may comprise a DRAM or other high speed capacitor-based memory. Note, however, that the underlying principles of the invention are not limited to these specific memory types. Additionally, the volatile memory 106 may have a relative lower density and/or may be more expensive to manufacture than the NVRAM 108.

In some embodiments, volatile memory 106 is configured between the NVRAM 108 and the internal processor caches. In some of the embodiments described below, volatile memory 106 is utilized to mask the performance and/or usage limitations of the NVRAM 108 including, for example, read/write latency limitations and memory degradation limitations. In these implementations, the combination of volatile memory 106 and NVRAM 108 operates at a performance level which approximates, is equivalent or exceeds a system which uses only DRAM as system memory.

In different embodiments, volatile memory 106 can be located on the processor die, located external to the processor die on a separate die located on the CPU package, located outside the CPU package with a high bandwidth link to the CPU package, for example, on a memory dual in-line memory module (DIMM), a riser/mezzanine, or a computer motherboard). In FIG. 1, volatile memory 106 is shown being located external to the CPU package. The volatile memory 106 may be communicatively coupled with the CPU 100 using a single or multiple high bandwidth links, such as DDR or other transactional high bandwidth links. A communicative coupling of devices refers to being coupled through an electrical, optical, wireless, or other form of link or combination of links to allow information to be passed back and forth between the devices that are coupled to one another. In some embodiments, the coupling is direct and allows information to pass directly from the first device to the second and, potentially, vice versa. In other embodiments, the coupling is indirect and requires the information to pass through one or more additional devices that reside along the route the information takes while being transferred between the two communicatively coupled devices in question.

3. Hybrid Memory Code and Data Storage for Processors

According to many embodiments, a hybrid memory solution in a computer system combining DRAM and PCMS storage or another type of NVRAM may be utilized to access both the code and data sections of a software application being executed is disclosed. As mentioned above, although other forms of NVRAM may be applicable to these solutions, the technical specifications of PCMS make it a quality candidate technology for non-volatile memory/storage. Thus, the examples shown will make use of PCMS memory, although in other embodiments, another form of NVRAM may be utilized.

In a computer system that includes an amount of PCMS memory/storage. Software applications and an operating system running on the computer system may both take advantage of a PCMS device's fast read capability. The fast reads may allow software application and operating system to execute code directly from PCMS on the processor.

In many embodiments, the operating system running on the computer system may be aware of the PCMS storage and will execute the operating system binaries directly out of physical PCMS address space. This execution is different from other forms of non-volatile memory, such as mass storage solutions, which instead require loading code (binaries) into a volatile memory, such as DRAM, prior to executing the code.

The operating system will build an interface for the software application and any driver software running on the operating system. According to many embodiments, the application and/or the driver will send requests to the operating system for buffers to store binary executable code that will not be modified during execution. The operating system then grants these buffers and provides pointers to them in the software application's and/or driver's allocated memory address space. Because the binaries in these buffers are not modified, there is generally an explicit indication/designation originated by the software, driver, and/or the operating system to make the buffers unmodifiable.

The operating system running on the system may treat the PCMS storage as a physical DRAM and map portions of the files that make up the operating system and software application into a memory management unit (MMU). When in the MMU, these file locations can be translated and stored similar to translation lookaside buffer (TLB) entries and addressed as if they were standard DRAM memory locations. From an operating system's logical address space to a physical PCMS device address location there may be multiple page walks to first get from a logical address that the operating system utilizes, to a platform physical address (PPA) that the underlying general memory management hardware utilizes for main DRAM memory, and finally to a direct physical PCMS device address. There may be one or more address mapping tables 132 (also known as address indirection tables) to accomplish this. In many embodiments, the address mapping tables 132 are stored in DRAM (volatile memory 106).

Apart from binary code storage in PCMS, there are other portions of software application, driver, and operating system information that may be stored adequately in physical PCMS space. Specifically, certain data (as opposed to code) sections of the software also may be storable in PCMS when that data is static or nearly static. Thus, in many embodiments there is at least a bit designation per data element that signifies whether the particular data element to be stored is or is not static. The static designated data elements may be stored in static (i.e., unmodifiable) buffers, whereas the non-static designated data elements may be stored in volatile (i.e. modifiable) buffers. This particular designation per buffer allows the OS to:

Determine when to allocate a buffer in actual DRAM vs. PCMS storage, wherein the buffer is allocated in DRAM if the buffer is designated as volatile and allocated in PCMS when the buffer is designated as static.

When allocating a buffer in DRAM, the operating system may simply follow a legacy page allocation procedure.

When allocating a buffer in PCMS (i.e., a buffer not requiring modification), the operating system may map physical PCMS device address space into its page tables to allow direct memory accesses to the PCMS device.

Optionally, the operating system may enforce the read only characteristics of a buffer by setting only read permissions for the PCMS buffer.

Figure 2:
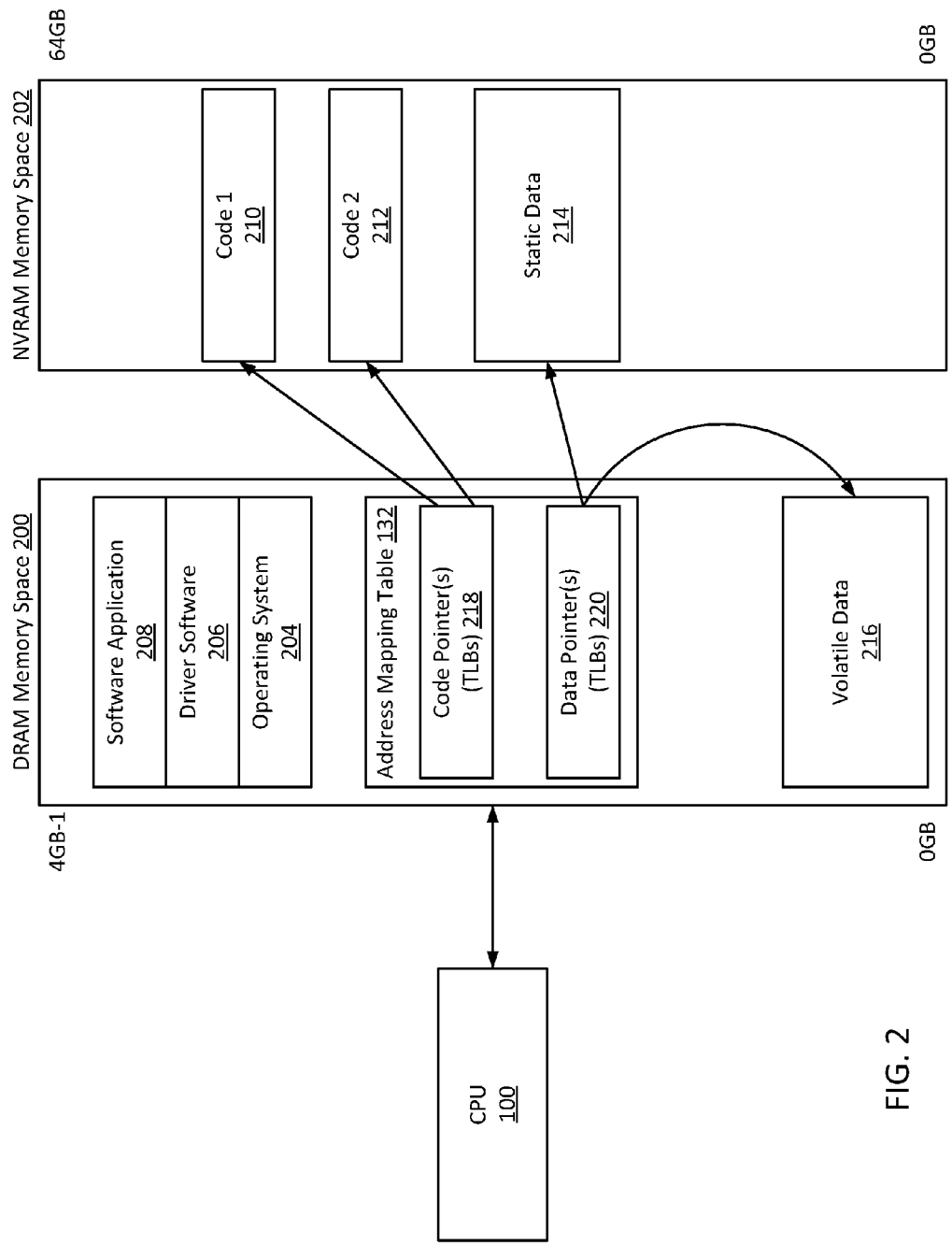
FIG. 2 describes an embodiment of volatile and non-volatile memory spaces when utilizing a software application hybrid code and data storage system.

FIG. 2 describes an embodiment of volatile and non-volatile memory spaces when utilizing a software application hybrid code and data storage system.

In FIG. 2 a DRAM memory space 200 (e.g., 4 GB of space) and an NVRAM memory space 202 (e.g., 64 GB of space) are present. There may be additional memory spaces, including a logical memory space in which the operating system controls, but those are not shown for sake of clarity. An operating system 204 is resident in DRAM memory space 200 and is being executed on the CPU 100. In many embodiments, driver software 206 is also resident in DRAM memory space 200 and is executing on the CPU 100 in conjunction with the operating system 204. At some point during operation, the operating system 204 loads a software application 208 into DRAM memory space 200. The load operation includes the operating system 204 reserving memory space for the software application 208. The reserved memory space includes space that is utilized to store the software application's binary executable code ("code") as well as space that is utilized to store any modifiable data ("data") the software application 208 uses to run.

As mentioned above, according to many embodiments, the code is generally static, as the binary files do not change during execution. On the other hand, data may change or it may not change, depending on a type of data. For example, static data (e.g., constants) will not change but volatile data (e.g., a stored variable that is recalculated based on continually changing input) does change. Thus, code and static data can be placed in a read-only section of memory, whereas volatile data would generally be placed in a read/write section of memory. In many embodiments, the software application 208 may be given the opportunity to preset portions of data and code with a storage-type bit. For example, if a structure that is defined by the software application as volatile (meaning data in the structure is modifiable), the software application may expressly relay that by setting a "volatile" bit for that structure. Then when the operating system 204 is allocating memory space to store the structure, it will see the "volatile" bit as set and know to allocate the structure in the volatile data section of DRAM memory space. Alternatively, if a data variable is declared as a constant value, the software application may clear the "volatile" bit to tell the operating system to allocate the data as static.

In a PCMS-based system, it is entirely plausible to store the code and static data in PCMS (i.e., NVRAM) memory space while still storing volatile data in DRAM memory. Thus, according to many embodiments, the operating system sets up an address mapping table 132 that stays resident in DRAM memory space 200. The operating system, while loading the software application 208, specifically stores the code (e.g., code 1 (210) and code 2 (212)) and static data 214 into NVRAM memory space 202 while storing the volatile data 216 in DRAM memory space 200. Once loaded, the operating system creates a group of code pointers 218 in the address mapping table 132 to point to each block of code stored in the NVRAM memory space 202. The operating system 204 also creates a group of data pointers 220 in the address mapping table 132 to point to each block of data stored in the NVRAM memory space 202 as well as each block of data stored in the DRAM memory space 200.

Figure 3:
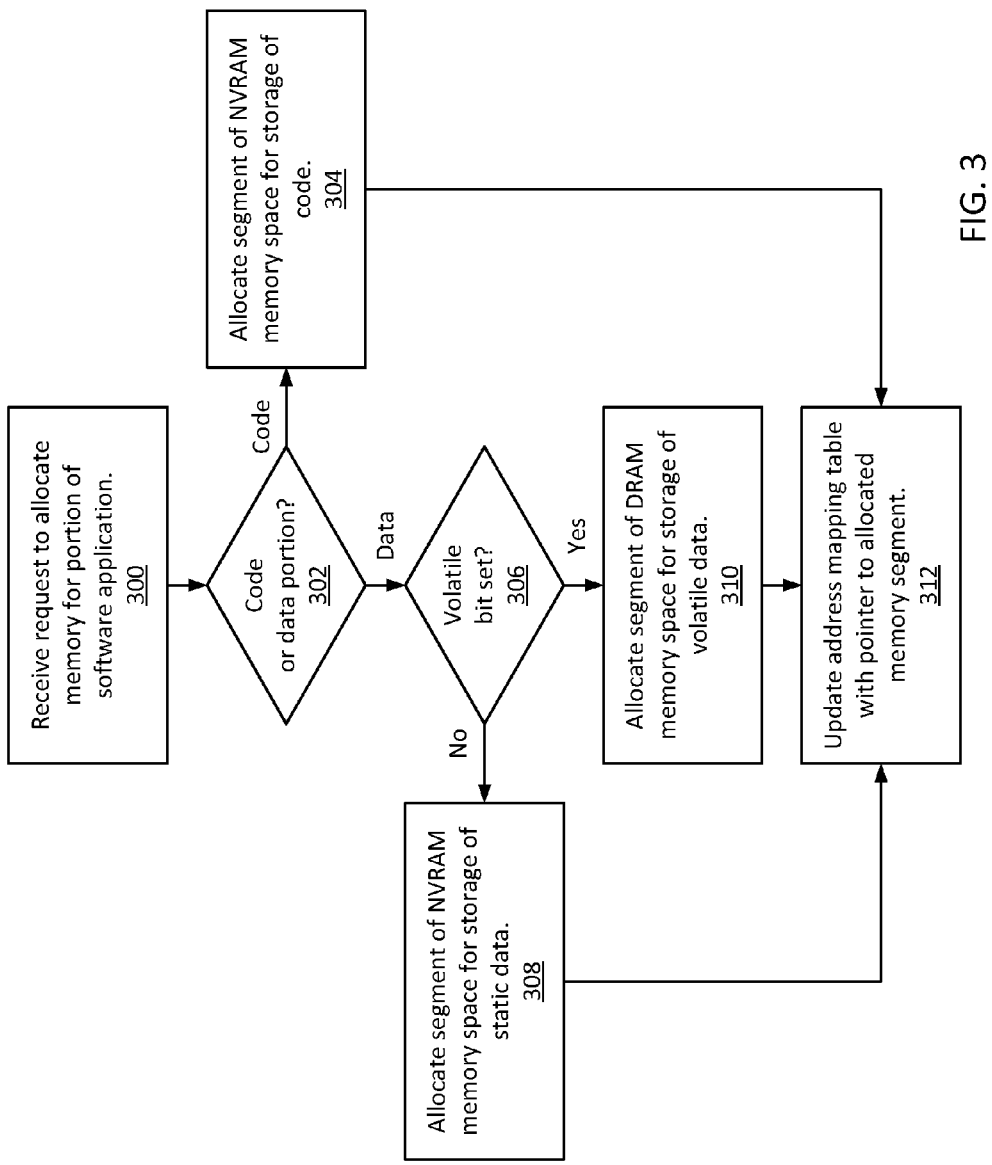
FIG. 3 is a flow diagram of an embodiment of a process to allocate volatile and non-volatile memory for code and data sections of a software application.

FIG. 3 is a flow diagram of an embodiment of a process to allocate volatile and non-volatile memory for code and data sections of a software application. The process is performed by processing logic which may comprise hardware, software, firmware, or a combination of two or more of these listed forms of processing logic.

The process begins with processing logic receiving a request to allocate memory for a portion of a software application (processing block 300). The request may come in the form of an automated or user-initiated decision to execute the software application. Once it is requested to launch and execute the software application, processing logic receives code (such as a binary executable file) and data (such as a data file) elements of the software application to load into one or more forms of memory to have access during execution of the software application.

For a given portion of the software application to be allocated, processing logic then determines whether that portion comprises code or data (processing block 302). If the portion comprises code, then processing logic allocates a segment of NVRAM memory space for storage of the code (processing block 304). If the portion comprises data, then processing logic next determines whether the data is volatile (processing block 306).

In many embodiments, there is a "volatile" bit that may be set or cleared for any given portion of the data to inform the processing logic whether the data may change during execution of the software application. In other embodiments that are not shown, there is not a volatile bit available but instead processing logic loads all data originally into NVRAM memory space and whenever a portion of the data is re-written over, processing logic then determines that portion is volatile and moves that element of data from an NVRAM allocated storage location to a DRAM allocated storage location.

Returning to block 306, if the volatile bit is not set, then processing logic allocates a segment of NVRAM memory space for storage of the portion of the static data (processing block 308). Alternatively, if the volatile bit is set, then processing logic allocates a segment of DRAM memory space for storage of the volatile data (processing block 310).

In any event, once memory space is allocated (from any of processing blocks 304, 308, or 310), then processing logic updates the address mapping table resident in DRAM with a pointer to the allocated memory segment in one of the three allocated sections of memory (i.e., the volatile data section, the static data section, or the code section).

Although application software is utilized as the example, this particular hybrid use of NVRAM and DRAM is not limited to application software. The operating system and driver binaries may also be similarly divided up and the static portions be placed in NVRAM while the volatile portions are placed in DRAM. This provides significant benefit in terms of reducing the amount of time required to resume from low power states—portions of the operating system and/or drivers would no longer need to be copied back into DRAM when resuming from a hibernate-to-disk state.

4. Hybrid Memory Code and Data Storage for Embedded Controllers

Many computing platforms have a number of embedded processors that are used for a wide range of applications. An embedded processor can also be referred to as a "microcontroller." Examples of embedded processors include manageability engines (which manage a computer system's security and out-of-band communications) and graphics embedded controllers, among others. These embedded controllers use firmware during runtime as instructions to execute many of their core functionalities. This firmware is typically stored on the computer system's flash memory (e.g., BIOS) or mass storage drive (e.g., hard drive, solid state drive, etc.). At system boot, the firmware is generally loaded into an internal SRAM in the embedded controller for execution.

There are significant issues with storing the firmware externally on the system flash memory hard drive such as:

The firmware can be tampered with, so embedded microcontrollers generally are required to perform an authentication at load time to verify the integrity of the firmware before execution.

Firmware stored either in the system flash memory or hard drive are subject to corruption, which can cripple the functionality of the embedded microcontrollers.

Execution must be preceded by a copy of the firmware into the local SRAM which is time consuming.

To address these limitations of embedded controllers, according to many embodiments, a PCMS-based storage is packaged with the embedded controller. The logic utilized to effectively replace system flash and/or a hard drive with a localized portion of PCMS memory would include:

A small amount of PCMS-based storage inside the component accessible to the embedded controller.

A segment of the PCMS-based storage set aside for the firmware code.

A segment of the PCMS-based storage set aside for storing persistent data that an application might want to store across boot sessions (e.g., digital rights management keys, offline movie usage records, etc.)

A cryptographic verification module that allows the PCMS firmware image to be overwritten only if the image is authentic.

An optional SRAM can be added to the embedded engine for runtime data storage (e.g., local variables, a stack, etc.) if the PCMS write latency adversely affects performance.

During boot of the computer system, the embedded controller may execute the firmware code directly out of the internal PCMS storage. This execute from PCMS directly is made possible because PCMS read latency matches DRAM unlike system flash or a hard drive.

Figure 4:
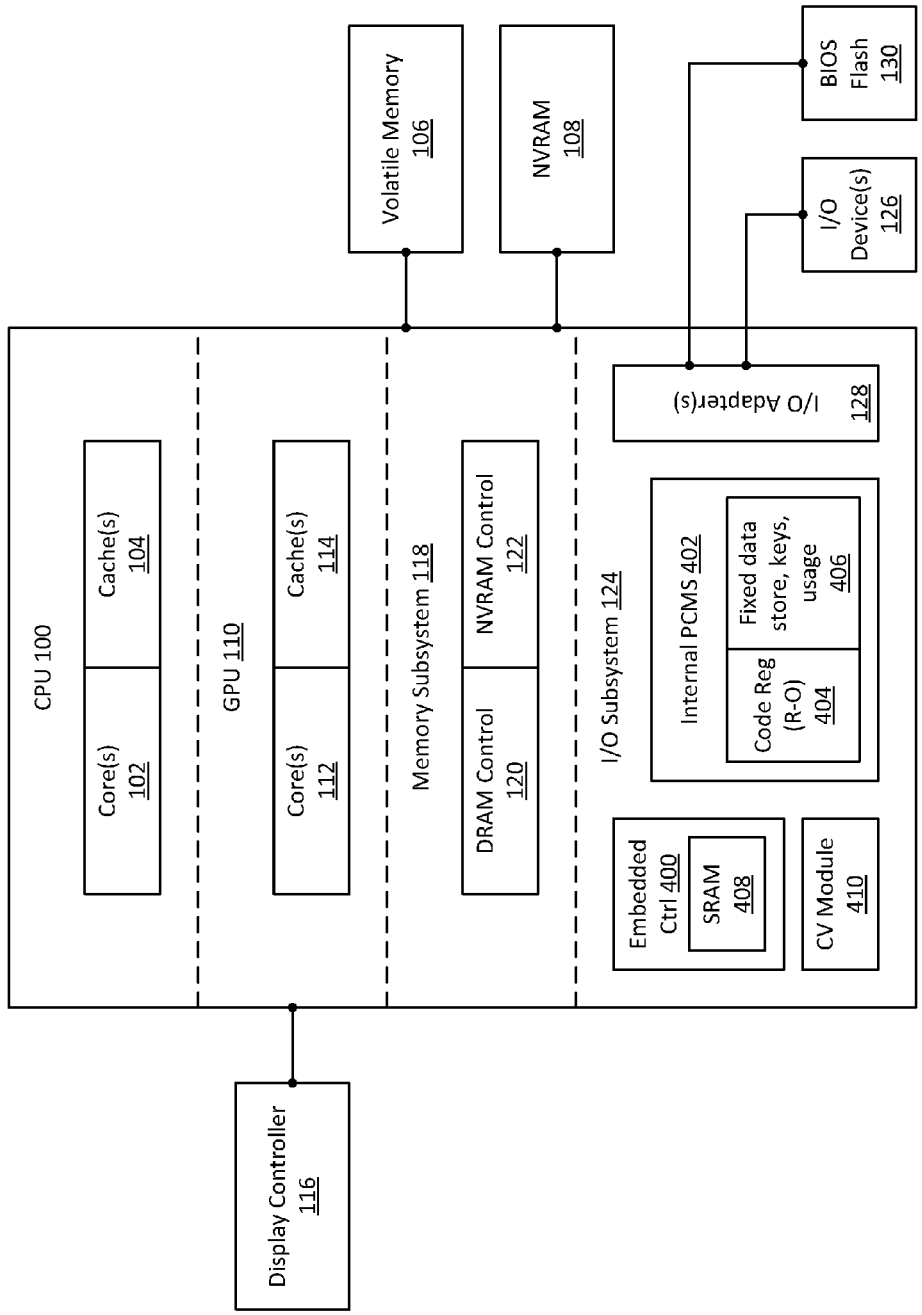
FIG. 4 illustrates an embodiment of a computer system that includes an embedded con roller which has direct access to a PCMS device internal to an I/O subsystem.

FIG. 4 illustrates an embodiment of a computer system that includes an embedded controller which has direct access to a PCMS device internal to an I/O subsystem.

The computer system shown in FIG. 4 may be generally equivalent to the computer system described in FIG. 1, outside of changes in the I/O subsystem 124. Thus, for detailed descriptions of other components, please refer to FIG. 1. Within the I/O subsystem 124, there is an embedded controller 400 and an internal PCMS memory 402 present in FIG. 4. The internal PCMS 402 stores static information related to firmware that the embedded controller 400 executes. During boot, the embedded controller 400 may directly execute firmware code from a read only (R-O) code region 404 stored in the internal PCMS 402. Additionally, the internal PCMS 402 may also store other information 406, such as fixed (i.e., static) data, keys for security applications (e.g., digital rights management), as well as usage information to be saved for a later time (e.g., number of times a user watches a given movie on the computer system). This stored information 406 is data that is either entirely static or rarely updated and also may include data that requires non-volatility through power cycling the computer system.

Furthermore, in many embodiments, the embedded controller 400 has an internal SRAM 408 portion of memory for storage of local variables, a stack, and/or other information that dynamically changes throughout the execution of the firmware. Thus, this information benefits from the fast write capabilities of the SRAM, as opposed to being limited to PCMS write speeds.

According to many embodiments, there is additionally a cryptographic verification (CV) hardware module 410 present in the I/O subsystem 124. The CV module is able to utilize hardware security verification key technology to require any updates/overwrites to any region of the stored firmware on the PCMS to be authenticated through any implemented form of security verification (e.g., public and private authentication modules using keys).

Figure 5:
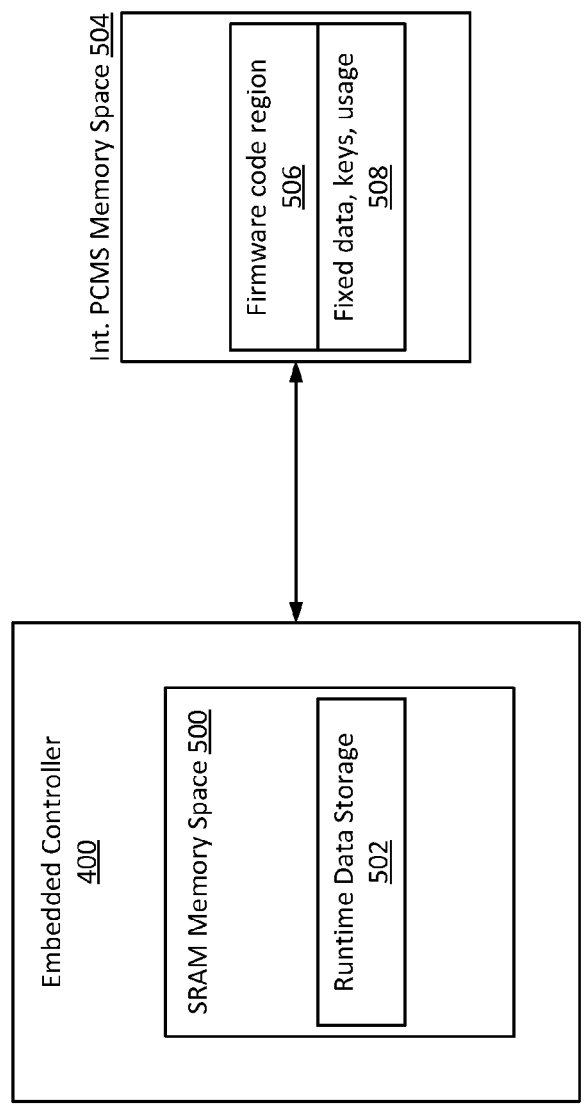
FIG. 5 describes an embodiment of volatile and non-volatile memory spaces in an I/O subsystem when utilizing a hybrid firmware code and data storage system.

FIG. 5 describes an embodiment of volatile and non-volatile memory spaces in an I/O subsystem when utilizing a hybrid firmware code and data storage system.

In FIG. 5, the embedded controller 400 has an internal SRAM memory space 500 that stores runtime data storage 502. The embedded controller 400 is additionally communicatively coupled to internal PCMS memory space 504, which stores a firmware code region 506 and other storage 508 that stores fixed/static data, keys, and required non-volatile usage information.

In the following description, numerous specific details such as logic implementations, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Embodiments of the invention may also be provided as a computer program product which may include a non-transitory machine-readable medium having stored thereon instructions which may be used to program a computer (or other electronic device) to perform a process. The non-transitory machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing electronic instructions. Embodiments of the invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

We claim:

1. A method comprising:
   reading a volatile bit variable for data segments of a software application, wherein a cleared volatile bit is to indicate a static data segment unlikely to be changed during execution of the software application, and a set volatile bit is to indicate a volatile data segment likely to be changed during execution of the software application;
   storing one or more static code segments of the software application in a phase nonvolatile random access memory (NVRAM) device, wherein the NVRAM device is to store the static code segments as byte addressable elements capable to be randomly accessed;
   storing one or more static data segments of the software application in the NVRAM device, based on reading the volatile bit variable to indicate the static data segments, wherein the NVRAM device is to store the static data segments as byte addressable elements capable to be randomly accessed;
   storing one or more volatile data segments of the software application in a volatile memory device, based on reading the volatile bit variable to indicate the volatile data segments;
   allocating an address mapping table with at least a first address pointer to point to the one or more static code segments, at least a second address pointer to point to the one or more static data segments, and at least a third address pointer to point to the one or more volatile data segments.

2. The method of claim 1, wherein the storing of the static code segments, the static data segments, and the volatile data segments further comprises:
   loading the software application for execution;
   identifying for the software application static code segments, static data segments, and volatile data segments; and
   storing the static code segments, the static data segments, and the volatile data segments in accordance with the identifying.

3. The method of claim 1, further comprising:
   initially storing all data segments of the software application in the NVRAM device;
   for a given data segment within the data segments, transferring the given data segment to the volatile memory device in response to reception of a rewrite request for the given data segment during execution of the software application.

4. The method of claim 1, further comprising:
   executing static code segments and static data segments directly from the NVRAM device without transferring to the volatile memory device.

5. The method of claim 1, wherein the software application comprises firmware and the volatile memory device comprises a static random access memory (SRAM) device integrated into an embedded controller.

6. The method of claim 1, wherein the NVRAM device comprises a memory device coupled directly to a memory controller on a memory bus.

7. A device comprising:

an embedded controller to execute one or more static code segments of a firmware directly from a nonvolatile random access memory (NVRAM) device, wherein the NVRAM device is to store the static code segments as byte addressable elements capable to be randomly accessed;

execute one or more static data segments of the firmware directly from the NVRAM device, the static data segments stored in the NVRAM device based on a cleared volatile bit to indicate a static data segment unlikely to be changed during execution of the software application, wherein the NVRAM device is to store the static data segments as byte addressable elements capable to be randomly accessed; and execute one or more volatile data segments of the firmware from a static random access memory device integrated into the embedded controller, the volatile data segments stored in the static random access memory device based on a set volatile bit is to indicate a volatile data segment likely to be changed during execution of the software application.

8. The device of claim 7, further comprising:

a cryptographic verification module to authenticate a new firmware code or data segment received from an external source;

wherein the embedded controller is configured to require authentication before execution of the new firmware code or data segment.

9. The device of claim 7, wherein the NVRAM device comprises a memory device coupled directly to a memory controller on a memory bus coupled to the embedded controller.

10. A system comprising:

a processor;

a volatile memory device to store memory allocation logic; and a nonvolatile random access memory NVRAM device;

wherein the memory allocation logic configured to cause the processor to read a volatile bit variable for data segments of a software application, wherein a cleared volatile bit is to indicate a static data segment unlikely to be changed during execution of the software application, and a set volatile bit is to indicate a volatile data segment likely to be changed during execution of the software application;

store one or more static code segments of a software application and one or more static data segments of the software application in the NVRAM device, wherein the NVRAM device is to store the static code segments as byte addressable elements capable to be randomly accessed;

store one or more static data segments of the software application in the NVRAM device, based on a read of the volatile bit variable to indicate the static data segments, wherein the NVRAM device is to store the static data segments as byte addressable elements capable to be randomly accessed;

store one or more volatile data segments of the software application in the volatile memory device, based on a read of the volatile bit variable to indicate the volatile data segments; and allocate an address mapping table in the volatile memory with at least a first address pointer to point to the one or more static code segments, at least a second address pointer to point to the one or more static data segments, and at least a third address pointer to point to the one or more volatile data segments.

11. The system of claim 10, further comprising the processor to load the software application for execution, identify for the software application static code segments, static data segments, and volatile data segments, and store the static code segments, the static data segments, and the volatile data segments in accordance with the identifying.

12. The system of claim 10, wherein the processor is to:

initially store all data segments of the software application in the NVRAM device; and for a given data segment within the data segments, transfer the given data segment to the volatile memory device in response to reception of a rewrite request for the given data segment during execution of the software application.

13. The system of claim 10, wherein the processor is to:

execute static code segments and static data segments directly from the NVRAM device without transferring to the volatile memory device.

14. The system of claim 10, wherein the processor comprises an embedded controller, the software application comprises firmware, and the volatile memory device comprises a static random access memory (SRAM) device integrated into an embedded controller.

15. The system of claim 10, wherein the NVRAM device comprises a memory device coupled directly to a memory controller on a memory bus coupled to the processor.

* * * * *